(12) United States Patent
Hendrix

(10) Patent No.: US 10,002,772 B2
(45) Date of Patent: Jun. 19, 2018

(54) VAPOR PHASE ETCHING OF HAFNIA AND ZIRCONIA

(71) Applicant: Entegris, Inc., Billerica, MA (US)

(72) Inventor: Bryan C. Hendrix, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days. days.

(21) Appl. No.: 15/613,773

(22) Filed: Jun. 5, 2017

(65) Prior Publication Data

US 2017/0352549 A1 Dec. 7, 2017

Related U.S. Application Data

(60) Provisional application No. 62/345,062, filed on Jun. 3, 2016.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/311* | (2006.01) |

(52) U.S. Cl.
CPC .............. *H01L 21/31122* (2013.01)

(58) Field of Classification Search
USPC .......................................... 216/58; 438/706
See application file for complete search history.

(56) References Cited

U.S. PATENT DOCUMENTS

2010/0099264 A1 4/2010 Elers
2016/0276214 A1* 9/2016 Fu .................... H01L 21/76816

FOREIGN PATENT DOCUMENTS

WO 2017/210518 A1 12/2017

OTHER PUBLICATIONS

Habuka, H., et al., "Hafnium Oxide Film Etching Using Hydrogen Chloride Gas," Japanese Journal of Applied Physics, vol. 48, Issue 12, pp. 125503-1-125503-3 (Dec. 21, 2009).

* cited by examiner

*Primary Examiner* — Roberts Culbert
(74) *Attorney, Agent, or Firm* — Entegris, Inc.

(57) ABSTRACT

A method is described for vapor phase etching of oxide material including at least one of hafnia ($HfO_2$) and zirconia ($ZrO_2$), in the absence of plasma exposure of the oxide material. The method involves contacting the oxide material with an etching medium including at least one of phosphorus chloride and tungsten chloride under conditions producing a removable fluid reaction product, and removing the removable fluid reaction product. The etching process may be controllably carried out by use of pressure swings, temperature swings, and/or modulation of partial pressure of Hf or Zr chloride in the reaction, e.g., to achieve precision etch removal in the manufacture of semiconductor devices such as 3D NAND, sub-20 nm DRAMs, and finFETs.

21 Claims, 6 Drawing Sheets

VAPOR PHASE ETCHING OF HAFNIA AND ZIRCONIA

FIELD

The present disclosure relates to vapor phase etching of hafnia ($HfO_2$) and zirconia ($ZrO_2$) and more specifically to etching of such type that is self-limiting in character and that is conducted without plasma exposure of the material being etched.

DESCRIPTION OF THE RELATED ART

High k dielectric materials are extensively used in the manufacture of semiconductor devices. Among high k dielectric materials, hafnia and zirconia are in widespread use. Manufacture of semiconductor devices requires that high k dielectric films be precisely sized and shaped in the overall device architecture. For this purpose, etching is employed, in which an etchant medium is contacted with the dielectric film to effect removal of dielectric film material.

The etching operation may employ wet etchant methods in which liquid chemical etching medium is contacted with the dielectric film. Such etching is capable of being carried out with high rates of material removal and high selectivity, but chemical costs for such etching are substantial. Alternatively, the etching operation may employ dry etching methods such as plasma, e.g., reactive ion etching techniques, in which ionized species contact the dielectric film to effect dielectric material removal. The reagent costs of dry etchant media are typically lower than those associated with use of liquid chemical etchants, but significant capital equipment costs are associated with ionization and plasma generation of the etching medium source material. Ion etching can also induce damage such as vacancies or charged point defects in sensitive regions of the semiconductor device.

Atomic layer etch (ALE) involving plasma etching has been contemplated to achieve layer-by-layer, or atom-by-atom, etching of deposited films, but as line widths decrease and the industry moves toward atomic-level scaling, ion-related damage associated with such technique becomes significant and requires new approaches. In device applications such as 3D NAND, sub-20 nm DRAMs, finFETs, and GAA (gate all around) and in other emerging device technologies, it becomes vital to provide self-limiting mono-atomic layer removal capabilities. In addition, some of these applications requires that the etching is isotropic, removing material evenly over a complex geometry.

It would therefore be advantageous to provide an etching technique that avoids the capital equipment costs associated with ionization and plasma generation, that avoids the large volumes of chemical typically required for chemical etching due to continuous replenishment requirements to maintain high rates of etching, and that is able to achieve ALE-scale removal of material such as hafnia and zirconia.

SUMMARY

The present disclosure relates to etching of hafnia and zirconia, e.g., in the manufacture of semiconductor products and microelectronic devices.

In one aspect, the disclosure relates to a method of vapor phase etching of oxide material comprising at least one of hafnia ($HfO_2$) and zirconia ($ZrO_2$), in the absence of plasma exposure of the oxide material, the method comprising contacting the oxide material with an etching medium comprising at least one of phosphorus chloride and tungsten chloride to effect reaction of the oxide material and etching medium, under conditions producing a removable fluid reaction product, and removing the removable fluid reaction product.

In another aspect, the disclosure relates to a method of vapor phase etching of oxide material comprising at least one of hafnia ($HfO_2$) and zirconia ($ZrO_2$), in the absence of plasma exposure of the oxide material, the method comprising contacting the oxide material with an etching medium comprising at least one of phosphorus chloride and tungsten chloride to effect reaction of the oxide material and etching medium, under conditions producing a liquid and/or solid reaction product that limits etching rate and/or etching depth of the oxide material in the vapor phase etching thereof, terminating the reaction of the oxide material and the etching medium, and removing the liquid and/or solid reaction product from the oxide material.

Other aspects, features, and advantages of the disclosure will be more fully apparent from the ensuing disclosure and claims.

DETAILED DESCRIPTION

The present disclosure relates to etching of hafnia and zirconia, and more specifically to vapor phase etching of hafnia (HfO$_2$) and zirconia (ZrO$_2$) and further specifically to etching of such type that is self-limiting in character and that is conducted without plasma exposure of the material being etched.

As used herein, the term "removable fluid reaction product" refers to gaseous or vapor-phase reaction product, and/or volatilizable liquid reaction product.

The disclosure relates in various particular aspects to vapor phase etching of hafnia and zirconia involving self-limiting etching reactions. In other aspects, the disclosure relates to vapor phase etching of hafnia and zirconia, in which such hafnium and/or zirconium oxide material is contacted with an etching medium comprising at least one of phosphorus chloride and tungsten chloride to effect reaction of the oxide material and etching medium, in which the reaction product comprises fluid(s), or fluid(s) and solid(s). The fluid reaction product(s) may be removed from the oxide material in any suitable manner, e.g., by pumping, vacuum drawing, displacement by a displacing fluid, reaction with a further reactant fluid, or in any other manner that separates the fluid reaction product(s) from the oxide material. The removal of the removable fluid reaction product(s) may be carried out during the vapor phase etching of the oxide material, or the vapor phase etching reaction may be terminated, following which the removal of the removable fluid reaction product(s) is carried out.

When the reaction of the oxide material and etching medium produces solid reaction product(s), the solid reaction product(s) may likewise be removed in any suitable manner, such as volatilization thereof by increasing temperature, reducing pressure, flowing inert gas over the solid reaction product(s) to maximize concentration gradient driving force for volatilization, reacting the solid reaction product(s) with a further reactant material to effect removal, and/or any other suitable modes and techniques for removing the solid reaction product(s) from the oxide material. The removal of the solid reaction product(s) may be carried out during the vapor phase etching of the oxide material, or the vapor phase etching reaction may be terminated, following which the removal of the solid reaction product(s) can be carried out.

It will be apparent from the ensuing disclosure that the vapor phase etching of hafnia and/or zirconia oxide materials can be carried out in any of numerous and variant manners to effectuate removal of such oxide materials, and that the methods can be readily and effectively deployed in semiconductor manufacturing operations involving hafnia and/or zirconia films or materials requiring precision formation in forming the semiconductor products, e.g., semiconductor devices, semiconductor device precursor assemblies and components, integrated circuitry, and numerous other products.

Figure 1:
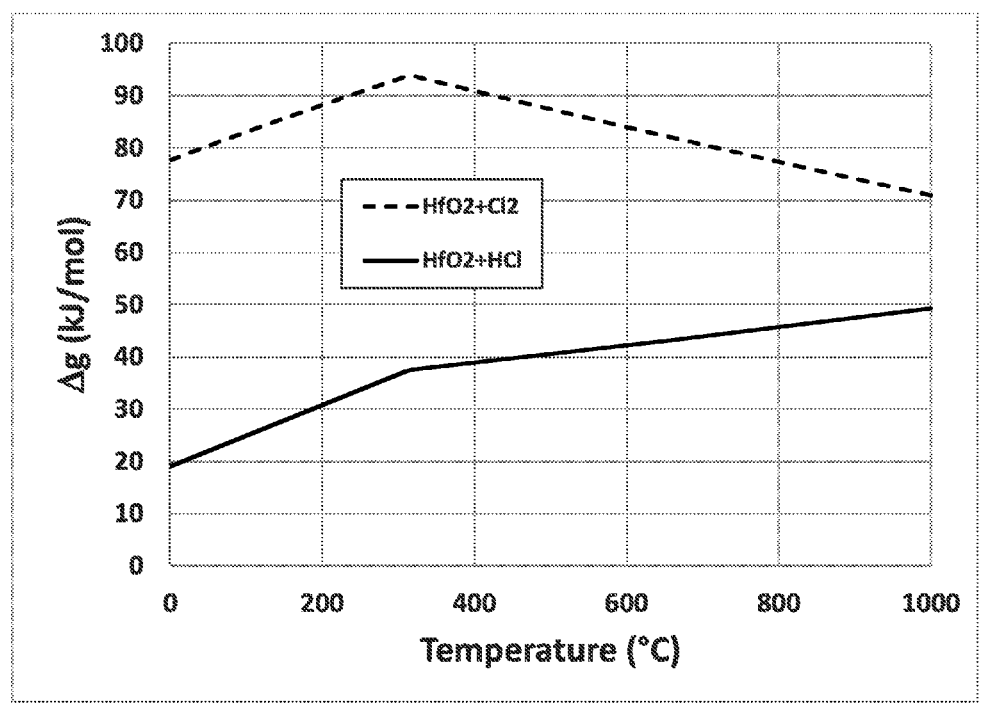
FIG. 1 is prior art which depicts a graph of free energy change $\Delta g$, in kJ/mol, as a function of temperature, in degrees Centigrade, for the reaction of hafnia and chlorine gas ($Cl_2$) (top line, dashed) and the reaction of hafnia and hydrogen chloride (bottom line, solid).

It is well-established that very stable oxides are difficult to volatilize. In the case of hafnium and zirconium, chlorides have some volatility in a temperature range of from 150° C. to 200° C., but HCl or even chlorine gas (Cl$_2$) does not react readily with the oxides to form chlorides. This is shown in FIG. 1, which is a graph of free energy change Δg, in kJ/mol, as a function of temperature, in degrees Centigrade, for the reaction of hafnia and chlorine gas (Cl$_2$) (top line, dashed) and the reaction of hafnia and hydrogen chloride (bottom line, solid), indicating a free energy change that is positive and well above zero. Accordingly, the graph of FIG. 1 shows that hafnia (HfO$_2$) does not convert to HfCl$_4$ readily in the presence of either chlorine gas or HCl.

The present disclosure in various aspects contemplates the use of volatile chlorides that have volatile oxychloride by-products to effect etch removal reaction. In order to utilize such volatile chloride etchants and control depth of etching by a self-limiting process, the etching reaction can be precisely controlled by use of pressure swings, temperature swings, and/or modulation of partial pressure of the Hf or Zr chloride in the reaction.

In specific embodiments, the etchant medium may comprise a tungsten chloride etchant such as WCl$_6$ and/or W$_2$Cl$_{10}$.

Figure 2:
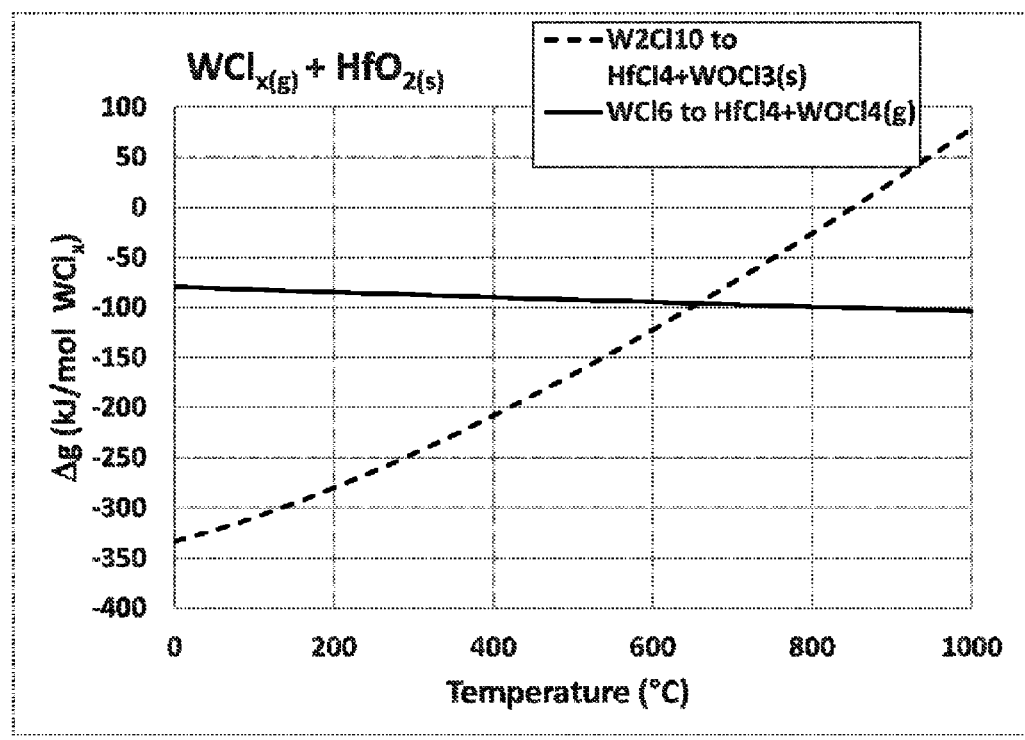
FIG. 2 is a graph of free energy change $\Delta g$, in kJ/mol, as a function of temperature, in degrees Centigrade, for the reaction $W_nClx_{(g)}+HfO_{2(s)}$, wherein n=1 or 2, in which the gaseous phase (g) tungsten chloride is reacted with the solid phase (s) hafnia, for (i) $WCl_{x(g)}=WCl_6$ in the reaction $WCl_{6(g)}+0.5\ HfO_{2(s)}=WOCl_{4(g)}+0.5\ HfCl_{4(g)}$, whose free energy change is shown by the curve in solidas being in a range of from −80 kJ/mol $WCl_{6(g)}$ to −105 kJ/mol $WCl_{6(g)}$ over the temperature range of from 0° C. to 1000° C., and (ii) $W_nClx_{(g)}=W_2Cl_{10}$ in the reaction $W_2Cl_{10(g)}+HfO_{2(s)}=2\ WOCl_{3(g)}+HfCl_{4(g)}$, whose free energy change is shown by the curve in dashed as being in a range of from −335 kJ/mol to −27 kJ/mol $W_2Cl_{10(g)}$ over the temperature range of from 0° C. to 800° C., and being negative ($\Delta g$, <0 kJ/mol) up to about 865° C.

FIG. 2 is a graph of free energy change Δg, in kJ/mol, as a function of temperature, in degrees Centigrade, for the reaction W$_n$Cl$_{x(g)}$+HfO$_{2(s)}$, wherein n=1 or 2, in which the gaseous phase (g) tungsten chloride is reacted with the solid phase (s) hafnia, for (i) WCl$_{x(g)}$=WCl$_6$ in the reaction WCl$_{6(g)}$+0.5 HfO$_{2(s)}$=WOCl$_{4(g)}$+0.5 HfCl$_{4(g)}$, whose free energy change is shown by the curve with the solid line as being in a range of from −80 kJ/mol to −105 kJ/mol over the temperature range of from 0° C. to 1000° C., and (ii) W$_n$Cl$_{x(g)}$=W$_2$Cl$_{10}$ in the reaction W$_2$Cl$_{10(g)}$+HfO$_{2(s)}$=WOCl$_{3(g)}$+HfCl$_{4(g)}$, whose free energy change is shown by the curve with the dashed line as being in a range of from −335 kJ/mol to −27 kJ/mol over the temperature range of from 0° C. to 800° C., and being negative (Δg, <0 kJ/mol) up to about 865° C.

FIG. 2 shows that the free energy of the reactions in which W$_n$Cl$_{x(g)}$ converts to the tungsten oxychloride and HfCl$_4$ in the presence of HfO$_2$ is negative over a wide range of temperatures. In addition, the change in enthalpy for these reactions is also significantly negative over the wide range of temperatures.

In the reaction WCl$_6$+0.5 HfO$_2$ =WOCl$_4$+0.5 HfCl$_4$, the WOCl$_4$ reaction product is more volatile than the incoming reactant WCl$_6$, so the WOCl$_4$ reaction product cannot be used to limit the etch depth. If temperature is kept in the 150-200° C. range in which HfCl$_4$ is volatile, then a continuous vapor phase etch can be achieved. In order to limit the etch depth, the process conditions can be selected so that HfCl$_4$ is less volatile. For example, a flow of HfCl$_4$ vapor above the surface being etched can limit the evaporation during the reaction step, with such flow of flow of HfCl$_4$ vapor being turned off during a clean-off step in which the flow of both WCl$_6$ and HfCl$_4$ are stopped and an inert gas such as N$_2$ or Ar is flowing. Alternatively, a lower temperature can be chosen for the reaction step, at which $WCl_6$ and $WOCl_4$ are volatile, but $HfCl_4$ stays on the surface, so that temperature thereafter can be raised to effect a clean-off step.

In an embodiment of the disclosure, the first half of the reaction at different temperature ranges for $WCl_6+0.5$ $HfO_2 = WOCl_4+0.5$ $HfCl_4$, can be shown in Table 1 below and wherein the second half clean off step, volatization of the $HfCl_4$ is facile in the 150-500° C. range. In Table 1, Delta H stands for the change in enthalpy, Delta S the change in entropy, and deltaG the change in Gibbs free energy as known to the person in the ordinary skill in the art.

TABLE 1

| 0.5 HfO2 + WCl6(g) = 0.5 HfCl4(s) + WOCl4(g) | | | |
|---|---|---|---|
| T ° C. | deltaH kJ | deltaS J/K | deltaG kJ |
| 100.0 | −72.6 | 26.5 | −82.5 |
| 110.0 | −72.7 | 26.4 | −82.8 |
| 120.0 | −72.7 | 26.2 | −83.0 |
| 130.0 | −72.8 | 26.1 | −83.3 |

In the reaction $W_2Cl_{10(g)}+HfO_{2(s)}=2$ $WOCl_{3(s)}+HfCl_{4(g)}$, the resulting $WOCl_3$ has low volatility and builds up to limit reaction depth. A clean-off step can then be conducted using chlorine ($Cl_2$) or higher temperature and HCl to remove the $WOCl_3$ as shown by FIG. 3.

Figure 3:
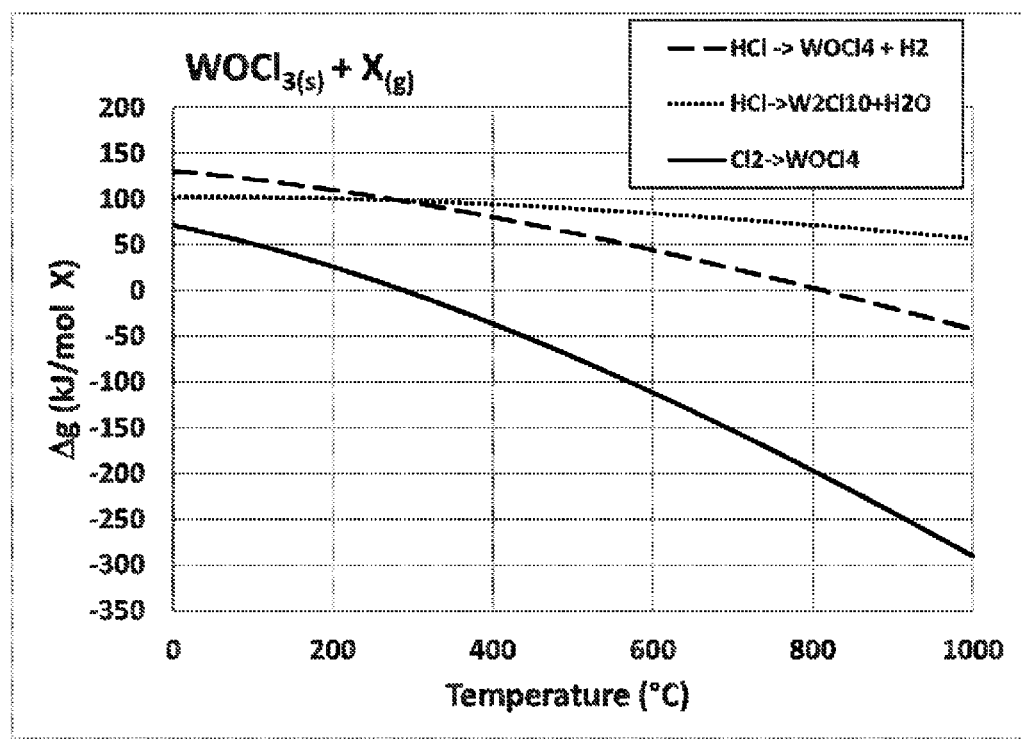
FIG. 3 is a graph of free energy change $\Delta g$, in kJ/mol of X, as a function of temperature, in degrees Centigrade, for the reaction $WOCl_{3(s)}+X_{(g)}$, in which the gaseous phase (g) X (=HCl or $Cl_2$) is reacted with the solid phase (s) oxychloride $WOCl_{3(s)}$, for the reactions: (i) $WOCl_{3(s)}+HCl_{(g)}=WOCl_{4(g)}+0.5\ H_{2(g)}$, whose free energy as shown by the dashed line including a 0° C. free energy of 130 kJ/mol HCl; (ii) $0.5\ WOCl_{3(s)}+HCl_{(g)}=0.25\ W_2Cl_{10(g)}+0.5\ H_2O$, whose free energy as shown by the dotted line including a 0° C. free energy of 100 kJ/mol HCl; and (iii) $2\ WOCl_{3(s)}+Cl_{2(g)}=2\ WOCl_{4(g)}$, whose free energy as shown by the solid line including a 0° C. free energy of 72 kJ/mol $Cl_2$.

FIG. 3 is a graph of free energy change $\Delta g$, in kJ/mol of X, as a function of temperature, in degrees Centigrade, for the reaction $WOCl_{3(s)}+X_{(g)}$, in which the gaseous phase (g) X (=HCl or $Cl_2$) is reacted with the solid phase (s) oxychloride $WOCl_{3(s)}$, for the reactions: (i) $WOCl_{3(s)}+HCl_{(g)}=WOCl_{4(g)}+0.5$ $H_{2(g)}$, whose free energy as shown by the dashed line including a 0° C. free energy of 130 kJ/mol HCl; (ii) 0.5 $WOCl_{3(s)}+HCl_{(g)}=0.25$ $W_2Cl_{10(g)}+0.5$ $H_2O$, whose free energy as shown by the dotted line including a 0° C. free energy of 100 kJ/mol HCl; and (iii) 2 $WOCl_{3(s)}+Cl_{2(g)}=2$ $WOCl_{4(g)}$, whose free energy as shown by the solid line including a 0° C. free energy of 72 kJ/mol $Cl_2$.

FIG. 3 thus evidences various routes for resetting a surface passivated by $WOCl_3$ as a result of the etch reaction, utilizing hydrogen chloride or chlorine gas. In respect of FIGS. 2 and 3, $WCl_6$ can work as an isotropic etchant, and $W_2Cl_{10}$ reacts to form a non-volatile product, with respect to which chlorine ($Cl_2$) can be used as a resetting agent.

In an embodiment of the disclosure, the first half of the reaction ($W_2Cl_{10(g)}+HfO_{2(s)}=2$ $WOCl_{3(s)}+HfCl_{4(g)}$ has a driving force at different temperature ranges as shown in Table 3; the second half of the reaction (2 $WOCl_{3(s)}+Cl_{2(g)}=2$ $WOCl_{4(g)}$ has a driving force as shown in Table 4. Wherein according to an embodiment of the disclosure the driving force is when the delta G is negative, the energetics are pushing the reaction forward, and we call this the driving force.

TABLE 3

| HfO2 +60 W2Cl10(g) = HfCl4(s) + 2WOCl3(s) | | | |
|---|---|---|---|
| T ° C. | deltaH kJ | deltaS J/K | deltaG kJ |
| 100.0 | −409.9 | −268.8 | −309.6 |
| 150.0 | −420.5 | −295.6 | −295.5 |
| 200.0 | −431.3 | −319.6 | −280.1 |
| 250.0 | −442.2 | −341.5 | −263.5 |
| 300.0 | −453.2 | −361.6 | −246.0 |
| 350.0 | −464.3 | −380.1 | −227.4 |
| 400.0 | −475.4 | −397.3 | −208.0 |
| 450.0 | −486.6 | −413.4 | −187.7 |
| 500.0 | −497.9 | −428.5 | −166.6 |

TABLE 4

| 2WOCl3(s) + Cl2(g) = 2WOCl4(g) | | | |
|---|---|---|---|
| T C. | deltaH kJ | deltaS J/K | deltaG kJ |
| 100.0 | 136.1 | 227.0 | 51.3 |
| 150.0 | 145.7 | 251.4 | 39.4 |
| 200.0 | 155.7 | 273.6 | 26.2 |
| 250.0 | 165.9 | 294.0 | 12.0 |
| 300.0 | 176.2 | 312.9 | −3.1 |
| 350.0 | 186.7 | 330.4 | −19.2 |
| 400.0 | 197.3 | 346.8 | −36.2 |
| 450.0 | 208.0 | 362.1 | −53.9 |
| 500.0 | 218.8 | 376.5 | −72.4 |

In this case, it is preferred to work in the 300-500° C. range to allow both half reactions to be facile without pressure variation and deltaG is negative for both the first half and second half of the reaction.

In other embodiments, phosphorous chlorides may be utilized as etchant media in accordance with the present disclosure.

Figure 4:
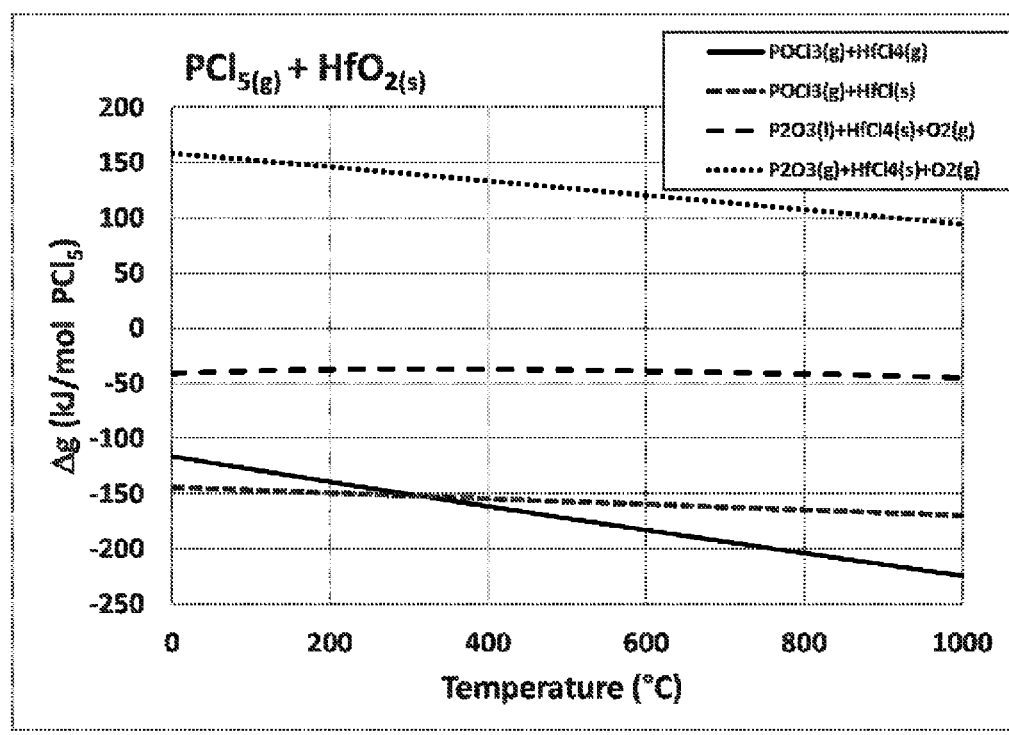
FIG. 4 is a graph of free energy change $\Delta g$, in kJ/mol, as a function of temperature, in degrees Centigrade, for the reactions (i) $PCl_{5(g)}+0.5\ HfO_{2(s)}=POCl_{3(g)}+0.5\ HfCl_{4(g)}$, whose free energy as shown by the solid line including a 0° C. free energy of −120 kJ/mol $PCl_5$; (ii) $PCl_{5(g)}+0.5\ HfO_{2(s)}=POCl_{3(g)}+0.5\ HfCl_{(s)}$, whose free energy as shown by the fine dashed line including a 0° C. free energy of −145 kJ/mol $PCl_5$; (iii) $PCl_{5(g)}+1.25\ HfO_{2(s)}=0.5\ P_2O_{3(l)}+1.25\ HfCl_{4(s)}+O_{2(g)}$, whose free energy as shown by the coarse dashed line including a 0° C. free energy of −42 kJ/mol $PCl_5$; and (iv) $PCl_{5(g)}+1.25\ HfO_{2(s)}=0.5\ P_2O_{3(g)}+$ 1.25 HfCl$_{4(s)}$+0.5 O$_{2(g)}$, whose free energy as shown by the dotted line including a 0° C. free energy of 158 kJ/mol PCl$_5$.

FIG. 4 is a graph of free energy change $\Delta g$, in kJ/mol, as a function of temperature, in degrees Centigrade, for the reactions (i) $PCl_{5(g)}+0.5$ $HfO_{2(s)}=POCl_{3(g)}+0.5$ $HfCl_{4(g)}$, whose free energy as shown by the solid line including a 0° C. free energy of −120 kJ/mol $PCl_5$; (ii) $PCl_{5(g)}+0.5$ $HfO_{2(s)}=POCl_{3(g)}+0.5$ $HfCl_{(s)}$, whose free energy as shown by the gray dashed line including a 0° C. free energy of −145 kJ/mol $PCl_5$; (iii) $PCl_{5(g)}+0.25$ $HfO_{2(s)}=0.5$ $P_2O_{3(l)}+1.25$ $HfCl_{4(s)}+0.5$ $O_{2(g)}$, whose free energy as shown by the black dashed line including a 0° C. free energy of −42 kJ/mol $PCl_5$; and (iv) $PCl_{5(g)}+1.25$ $HfO_{2(s)}=0.5$ $P_2O_{3(g)}+1.25$ $HfCl_{4(s)}+0.5$ $O_{2(g)}$, whose free energy as shown by the dotted line including a 0° C. free energy of 158 kJ/mol $PCl_5$.

FIG. 4 shows that the free energy is highly favorable to form $POCl_3$ from $PCl_5$ and $HfO_2$, and that the reaction of $PCl_5+HfO_2$ to form $POCl_3+HfCl_4$ is particularly favored at temperatures above about 300° C. over the reaction of $PCl_5+HfO_2$ to form $POCl_3+HfCl$. Enthalpy changes (delta H) are also favorable for such reactions of $PCl_5+HfO_2$. In the reactions of $PCl_5+HfO_2$, etching can be limited by modulating the temperature or the partial pressure of $HfCl_4$ can be used to control the etch rate and/or limit the etch thickness. Tables 5 and 6 show the driving force for these reactions from 100 to 500° C.

TABLE 6

| | PCl5(g) + 0.5HfO2 = POCl3(g) + 0.5HfCl4 (s) | | |
|---|---|---|---|
| T C. | deltaH kJ | deltaS J/K | deltaG kJ |
| 100.0 | −137.0 | 25.9 | −146.6 |
| 150.0 | −137.0 | 25.9 | −147.9 |
| 200.0 | −137.0 | 25.9 | −149.2 |
| 250.0 | −137.0 | 25.8 | −150.5 |
| 300.0 | −137.0 | 25.8 | −151.8 |
| 350.0 | −137.0 | 25.8 | −153.1 |
| 400.0 | −137.0 | 25.8 | −154.4 |
| 450.0 | −137.0 | 25.8 | −155.7 |
| 500.0 | −137.0 | 25.8 | −156.9 |

TABLE 5

| | PCl5(g) + 0.5HfO2 = POCl3(g) + 0.5HfCl4 (g) | | |
|---|---|---|---|
| T C. | deltaH kJ | deltaS J/K | deltaG kJ |
| 100.0 | −84.7 | 115.8 | −127.9 |
| 150.0 | −85.2 | 114.4 | −133.6 |
| 200.0 | −85.8 | 113.1 | −139.3 |
| 250.0 | −86.4 | 111.9 | −144.9 |
| 300.0 | −87.0 | 110.8 | −150.5 |
| 350.0 | −87.6 | 109.8 | −156.0 |
| 400.0 | −88.2 | 108.9 | −161.5 |
| 450.0 | −88.8 | 108.0 | −166.9 |
| 500.0 | −89.4 | 107.2 | −172.3 |

TABLE 6

| | PCl3(g) + 0.75HfO2 = 0.5 P2O3(l) + 0.75 HfCl4(s) | | |
|---|---|---|---|
| T C. | deltaH kJ | deltaS J/K | deltaG kJ |
| 100.0 | −180.7 | −132.4 | −131.3 |
| 150.0 | −178.7 | −127.3 | −124.8 |
| 200.0 | −176.8 | −123.1 | −118.5 |
| 250.0 | −174.9 | −119.4 | −112.5 |
| 300.0 | −173.1 | −116.1 | −106.6 |
| 350.0 | −171.4 | −113.3 | −100.8 |
| 400.0 | −169.8 | −110.7 | −95.3 |
| 450.0 | −168.1 | −108.3 | −89.8 |
| 500.0 | −166.5 | −106.2 | −84.4 |

TABLE 7

| | 0.5 P2O3(l) + HCl(g) + Cl2(g) = POCl3(g) + 0.5 H2O(g) | | |
|---|---|---|---|
| T C. | deltaH kJ | deltaS J/K | deltaG kJ |
| 100 | −25.9 | −69.4 | 0.0 |
| 150 | −27.3 | −72.9 | 1.8 |
| 200 | −28.6 | −75.7 | 3.6 |
| 250 | −29.8 | −78.1 | 5.6 |
| 300 | −30.9 | −80.2 | 7.5 |
| 350 | −31.9 | −81.9 | 9.6 |
| 400 | −32.9 | −83.5 | 11.6 |
| 450 | −33.9 | −84.9 | 13.7 |
| 500 | −34.8 | −86.1 | 15.9 |

Figure 5:
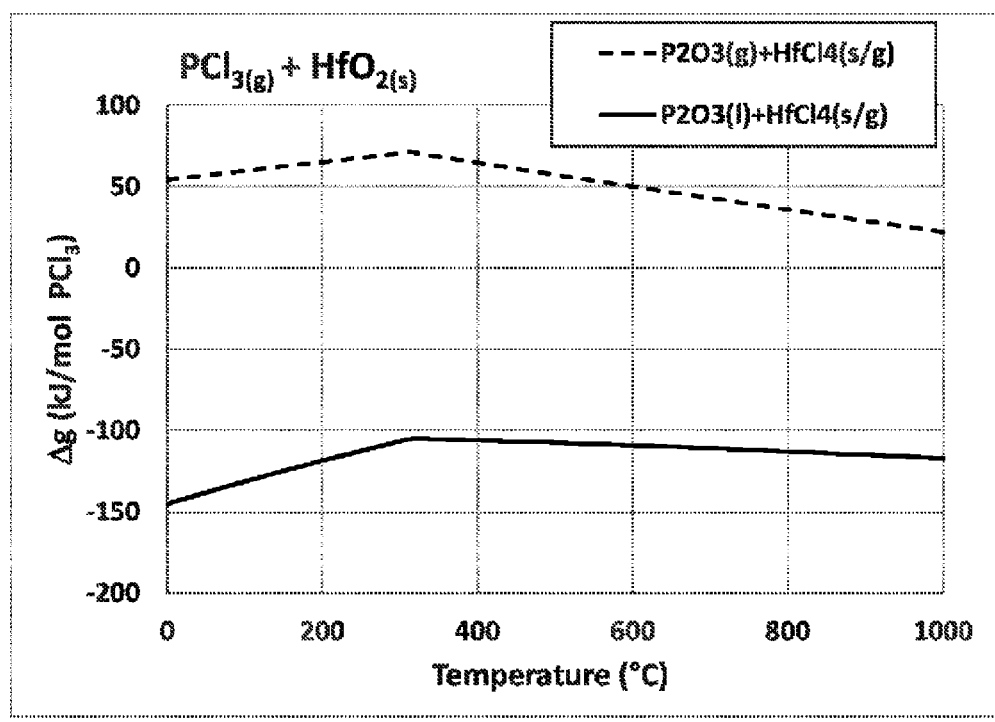
FIG. 5 is a graph of free energy change Δg, in kJ/mol, as a function of temperature, in degrees Centigrade, for the reactions (i) PCl$_{3(g)}$+0.75 HfO$_{2(s)}$=0.5 P$_2$O$_{3(g)}$+0.75 HfCl$_{4(s)}$, whose free energy as shown by the dashed line including a 0° C. free energy of 55 kJ/mol PCl$_3$, and (ii) PCl$_{3(g)}$+0.75 HfO$_{2(s)}$=0.5 P$_2$O$_{3(l)}$+0.75 HfCl$_{4(s)}$, whose free energy as shown by the solid line including a 0° C. free energy of −146 kJ/mol PCl$_3$.

FIG. 5 is a graph, illustrating another embodiment that uses $PCl_3$. FIG. 5 shows the free energy change $\Delta g$, in kJ/mol, as a function of temperature, in degrees Centigrade, for the reactions (i) $PCl_{3(g)} + 0.75\ HfO_{2(s)} = 0.5\ P_2O_{3(g)} + 0.75\ HfCl_{4(s)}$, whose free energy as shown by the dashed line including a 0° C. free energy of 55 kJ/mol $PCl_3$, and (ii) $PCl_{3(g)} + 0.75\ HfO_{2(s)} = 0.5\ P_2O_{3(l)} + 0.75\ HfCl_{4(s)}$, whose free energy as shown by the solid line including a 0° C. free energy of −146 kJ/mol $PCl_3$.

The data shown in FIG. 5 show that the etching process can be carried out according to reaction (ii), with liquid $P_2O_3$ being formed on the surface undergoing etching. Such liquid $P_2O_3$ can be left on the surface, and thereafter be removed by flowing a mixture of HCl and $Cl_2$ over the surface in a clean-off step.

Figure 6:
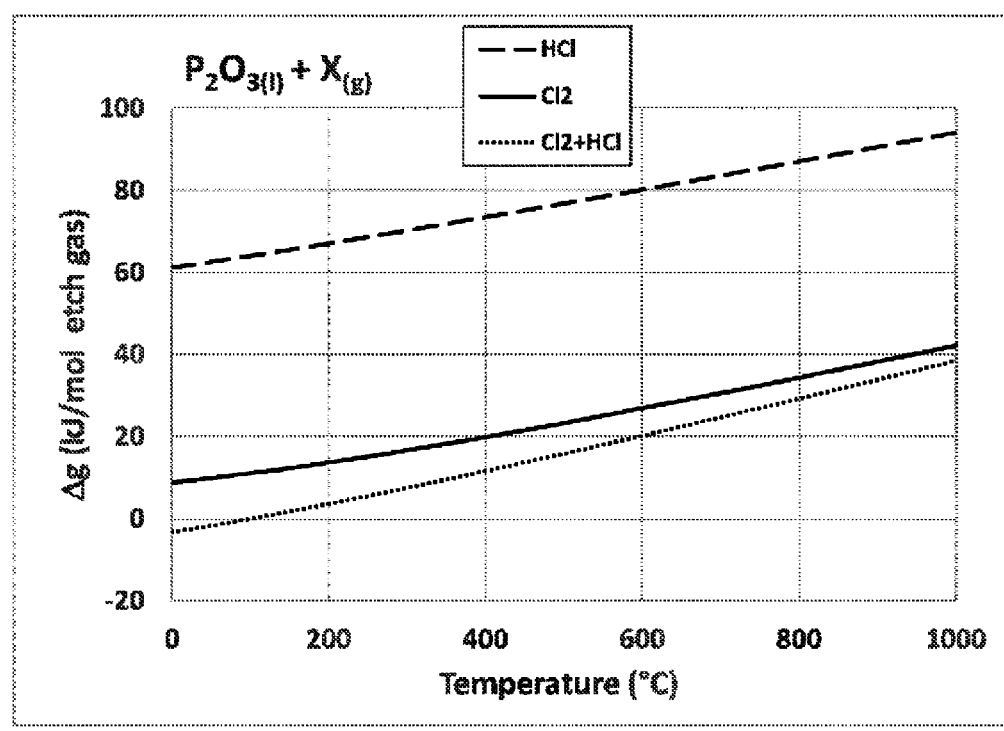
FIG. 6 is a graph of free energy change Δg, in kJ/mol etch gas, as a function of temperature, in degrees Centigrade, for the reactions of P$_2$O$_{3(l)}$+X$_{(g)}$, wherein: (i) X=HCl$_{(g)}$, whose free energy as shown by the dashed line including a 0° C. free energy of 61 kJ/mol etch gas; (ii) X=Cl$_{2(g)}$, whose free energy as shown by the solid line including a 0° C. free energy of 10 kJ/mol etch gas; and (iii) X=Cl$_{2(g)}$+HCl$_{(g)}$, whose free energy as shown by the dotted line including a 0° C. free energy of −3 kJ/mol etch gas.

FIG. 6 is a graph of free energy change $\Delta g$, in kJ/mol etch gas, as a function of temperature, in degrees Centigrade, for the reactions of $P_2O_{3(l)} + X_{(g)}$, wherein: (i) $X=HCl_{(g)}$, whose free energy as shown by the dashed line including a 0° C. free energy of 61 kJ/mol etch gas; (ii) $X=Cl_{2(g)}$, whose free energy as shown by the solid line including a 0° C. free energy of 10 kJ/mol etch gas; and (iii) $X=Cl_{2(g)} + HCl_{(g)}$, whose free energy as shown by the dotted line including a 0° C. free energy of −3 kJ/mol etch gas.

According to an embodiment of the disclosure, the data shown in FIG. 6 indicate that a $Cl_{2(g)} + HCl_{(g)}$ mixture will be most effective at clearing a passive layer of $P_2O_{3(l)}$ on the substrate.

The thermodynamic driving force for this first half reaction is shown in Table 6, whereas the thermodynamic driving force for the second half of the reaction is shown in Table 7.

According to the embodiments of the disclosure, with negative enthalpy, the second half reaction will be driven forward by keeping the pressures of HCl and $Cl_2$ significantly higher than the byproduct $POCl_3$ and $H_2O$ vapors.

In considering FIGS. 4 and 6, it is seen that the most stable reaction is $PCl_{5(g)} + 0.5\ HfO_{2(s)} \rightarrow POCl_{3(g)} + 0.5\ HfCl_{4(g)}$. When such reaction is carried out at lower temperature where $HfCl_4$ is a solid, the reaction can be conducted at sufficiently fast rate to be self-limiting in character. Additionally, when the etch reaction producing $P_2O_3$ with $O_2$ evolution is carried out at kinetically favorable conditions, self-limiting etch processing is achieved.

In respect of FIGS. 5 and 6, when $PCl_3$ is used as an etchant, then $P_2O_{3(l)}$ will have low volatility over the entire temperature range, and a self-limiting process can be utilized with a reset (clean-off step) utilizing chlorine ($Cl_2$).

Accordingly, the disclosure contemplates in one aspect a method of vapor phase etching of oxide material comprising at least one of hafnia ($HfO_2$) and zirconia ($ZrO_2$), in the absence of plasma exposure of the oxide material, the method comprising contacting the oxide material with an etching medium comprising at least one of phosphorus chloride and tungsten chloride to effect reaction of the oxide material and etching medium, under conditions producing a removable fluid reaction product, and removing the removable fluid reaction product. In such method, the oxide material may comprise hafnia ($HfO_2$), zirconia ($ZrO_2$), or both of hafnia ($HfO_2$) and zirconia ($ZrO_2$), e.g., on a wafer, microelectronic device precursors structure, or other substrate.

In various embodiments, the above described method of the present disclosure may be carried out, wherein the contacting of the oxide material with the etching medium results in a self-limiting reaction of the oxide material and the etching medium.

In other embodiments, the above described method of the present disclosure may be carried out, as further comprising modulating the reaction of the oxide material and the etching medium to control depth of etching of the oxide material by the etching medium. For example, the modulating may comprise at least one of (i) pressure swing modulation, (ii) temperature swing modulation, and (iii) modulation of partial pressure of hafnium chloride and/or zirconium chloride formed in the reaction of the oxide material with the etching medium.

The method of the present disclosure as variously described herein may be conducted so that the reaction of the oxide material and the etching medium produces volatile oxychloride byproduct as at least part of the removable reaction product.

In various embodiments, the etching medium employed in the method of the present disclosure may comprise a tungsten chloride etchant, e.g., $WCl_6$, $W_2Cl_{10}$, or both $WCl_6$ and $W_2Cl_{10}$. For example, the above described method of the disclosure may be conducted, in which the reaction of the oxide material and the etching medium comprises the reaction $WCl_6 + 0.5\ HfO_2 \rightarrow WOCl_4 + 0.5\ HfCl_4$. Such reaction may for example be conducted at temperature in a range of from 150 to 200° C., or other suitable temperature range, and the reaction may for example be conducted at conditions limiting the etch depth of the vapor phase etching of the oxide material. The conditions limiting the etch depth of the vapor phase etching of the oxide material may for example comprise flowing $HfCl_4$ vapor over the oxide material during the contacting of the oxide material with the etching medium. In various embodiments, the method of the present disclosure may be carried out, in which removing the removable fluid reaction product comprises volatilizing $HfCl_4$, as the removable fluid reaction product, after terminating the reaction of the oxide material and etching medium, and the flowing of $HfCl_4$ vapor over the oxide material.

Accordingly, the present disclosure contemplates various implementations, in which removing the removable fluid reaction product comprises volatilizing $HfCl_4$, as the removable fluid reaction product. The vapor phase etching method may be carried out in particular embodiments, in which the reaction of the oxide material and etching medium is conducted at temperature at which $HfCl_4$ produced by the reaction is retained on the oxide material in liquid form, and the removing comprises increasing temperature of the oxide material to volatilize the $HfCl_4$ therefrom.

In other embodiments, the method of the present disclosure may be carried out, wherein the reaction of the oxide material and the etching medium comprises the reaction $W_2Cl_{10(g)} + HfO_{2(s)} = 2\ WOCl_{3(s)} + HfCl_{4(g)}$. The reaction conditions of such reaction may for example comprise conditions under which etching depth is limited by formation of $WOCl_{3(s)}$ as a reaction product. The method may further comprise removing the $WOCl_{3(s)}$ reaction product, e.g., in which removing the $WOCl_{3(s)}$ reaction product comprises reacting the $WOCl_{3(s)}$ reaction product with at least one of chlorine ($Cl_2$) and HCl, to effect removal of the $WOCl_{3(s)}$ reaction product from the oxide material. Removing the $WOCl_{3(s)}$ reaction product may in various embodiments comprises reacting the $WOCl_{3(s)}$ reaction product with chlorine ($Cl_2$), or with HCl, or with a mixture of chlorine ($Cl_2$) and HCl.

In a further embodiment of the disclosure, to control the depth of the etching of the oxide material the reactions can be repeated to modulate between the $W_2Cl_{10}$ and the $Cl_2$ or HCl in the etching medium.

In general, the etching medium in the broad practice of the vapor phase etching method of the present disclosure may be of any suitable type. In various embodiments, the etching medium comprises a tungsten chloride etchant, e.g., $PCl_5$. The etching medium may be formulated so that the reaction of the oxide material and the etching medium produces $POCl_{3(g)}$.

In specific embodiments, the method of the present disclosure may be carried out, as comprising modulating temperature in the reaction conditions to limit the vapor phase etching of the oxide material.

In a specific embodiment, the reaction of the oxide material and the etching medium comprises the reaction $PCl_5 + 0.5\ HfO_2 \rightarrow POCl_3 + 0.5\ HfCl_4$. In such embodiment, or otherwise in the practice of the method of the present disclosure, the method may comprise modulating partial pressure of $HfCl_4$ in the reaction conditions to control the etch rate and/or to limit the etch thickness in the vapor phase etching of the oxide material.

In other implementations, the methodology of the present disclosure may encompass use of a tungsten chloride etchant comprising $PCl_3$, e.g., in which the reaction of the oxide material and etching medium involves the reaction $PCl_{3(g)} + 0.75\ HfO_{2(s)} = 0.5\ P_2O_{3(l)} + 0.75\ HfCl_{4(s)}$. In still other aspects, the method of the present disclosure may be carried out, in which the reaction of the oxide material and etching medium is conducted at temperature at which $P_2O_3$ produced by the reaction is retained on the oxide material in liquid form, and the removing comprises flowing at least one of HCl and $Cl_2$ over the oxide material to remove $P_2O_3$ therefrom. For example, the removing may include flowing a mixture of HCl and $Cl_2$ over the oxide material to remove $P_2O_3$ therefrom.

In a further embodiment of the disclosure, to control the depth of the etching of the oxide material the reactions can be repeated to modulate between the $PCl_3$ and the $Cl_2$ or HCl in the etching medium.

In other implementations, the method of the present disclosure may be carried out, in which the reaction of the oxide material and the etching medium comprises the reaction $PCl_{5(g)} + 0.5\ HfO_{2(s)} \rightarrow POCl_{3(g)} + 0.5\ HfCl_{4(g)}$.

In still other implementations, the method of the present disclosure may be carried out, wherein the reaction of the oxide material in the etching medium also produces a non-fluid reaction product. The non-fluid reaction product may for example comprise a solid reaction product that accumulates on the oxide material and causes the reaction of the oxide material and the etching medium to be self-limiting in character. The solid reaction product in such methodology may comprise $HfCl_4$.

The disclosure also contemplates implementations of the vapor phase etching method of the present disclosure in which the removable fluid reaction product comprises $P_2O_3$ and the reaction of the oxide material and the etching medium is conducted so that $P_2O_{3(l)}$ accumulates on the oxide material and causes the reaction of the oxide material and the etching medium to be self-limiting in character. The methodology may in specific embodiments comprise removing the accumulated $P_2O_{3(l)}$ from the oxide material by contacting the accumulated $P_2O_{3(l)}$ with at least one of HCl and $Cl_2$.

The above described method of the present disclosure may also be conducted, in which the reaction of the oxide material and the etching medium produces, in addition to the removable fluid reaction product, a solid reaction product that accumulates on the oxide material and causes the reaction of the oxide material and the etching medium to be self-limiting in character. Such method may in specific applications further comprise removing the accumulated solid reaction product from the oxide material. The removal of the accumulated solid reaction product from the oxide material may for example be carried out by reacting the accumulated solid reaction product with a removingly effective chemical reactant. The removingly effective chemical reactant may be of any suitable type, and may for example comprise at least one of HCl and $Cl_2$.

The disclosure in another aspect relates to a method of vapor phase etching of oxide material comprising at least one of hafnia ($HfO_2$) and zirconia ($ZrO_2$), in the absence of plasma exposure of the oxide material, the method comprising contacting the oxide material with an etching medium comprising at least one of phosphorus chloride and tungsten chloride to effect reaction of the oxide material and etching medium, under conditions producing a liquid and/or solid reaction product that limits etching rate and/or etching depth of the oxide material in the vapor phase etching thereof, terminating the reaction of the oxide material and the etching medium, and removing the liquid and/or solid reaction product from the oxide material.

In such vapor phase etching method, the removal of the liquid and/or solid reaction product from the oxide material may comprise volatilizing the liquid reaction product. Additionally, or alternatively, the removal of liquid and/or solid reaction product from the oxide material may comprise reacting the liquid and/or solid reaction product with a removingly effective chemical reactant, e.g., a removingly effective chemical reactant that is reacted with the liquid and/or solid reaction product to produce a gaseous or vapor reaction product. The removingly effective chemical reactant in specific embodiments may be of any suitable type, and may for example comprise at least one of HCl and $Cl_2$.

It will therefore be appreciated that vapor phase etching of hafnia and/or zirconia materials may be carried out in accordance with the present disclosure in an effective and cost-efficient manner, which moreover avoids the need for ionization and plasma generation equipment, avoids plasma damage to devices, and which is effective for precision formation of hafnia and zirconia films in semiconductor device and other applications.

Accordingly, while the disclosure has been set out herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A method of vapor phase etching comprising:
   contacting the oxide material with an etching medium to effect reaction of the oxide material and etching medium, wherein the oxide material comprises at least one of hafnia ($HfO_2$) and zirconia ($ZrO_2$), in the absence of plasma exposure of the oxide material, and wherein the etching medium comprises at least one of phosphorus chloride and tungsten chloride;
   under conditions producing a removable fluid reaction product; and
   removing the removable fluid reaction product.

2. The method of claim 1, wherein the contacting of the oxide material with the etching medium results in a self-limiting reaction of the oxide material and the etching medium.

3. The method of claim 1, further comprising modulating the reaction of the oxide material and the etching medium to control depth of etching of the oxide material by the etching medium.

4. The method of claim 3, wherein the modulating comprises at least one of (i) pressure swing modulation, (ii) temperature swing modulation, and (iii) modulation of partial pressure of hafnium chloride and/or zirconium chloride formed in the reaction of the oxide material with the etching medium.

5. The method of claim 1, wherein the reaction of the oxide material and the etching medium produces volatile oxychloride byproduct as at least part of the removable reaction product.

6. The method of claim 1, wherein the etching medium comprises a tungsten chloride etchant comprising at least one of $WCl_6$, $W_2Cl_{10}$, and $PCl_3$, $PCl_5$.

7. The method of claim 1, wherein the reaction of the oxide material and the etching medium comprises the reaction $WCl_6 + 0.5\ HfO_2 \rightarrow WOCl_4 + 0.5\ HfCl_4$.

8. The method of claim 7, wherein removing the removable fluid reaction product comprises volatilizing $HfCl_4$, as the removable fluid reaction product.

9. The method of claim 1, wherein the reaction of the oxide material and the etching medium comprises the reaction $W_2Cl_{10(g)} + HfO_{2(s)} = 2\ WOCl_{3(s)} + HfCl_{4(g)}$.

10. The method of claim 6, wherein the reaction of the oxide material and the etching medium comprises the reaction $PCl_5 + 0.5\ HfO_2 \rightarrow POCl_3 + 0.5\ HfCl_4$.

11. The method of claim 6, wherein the reaction of the oxide material and etching medium comprises the reaction $PCl_{3(g)} + 0.75\ HfO_{2(s)} = 0.5\ P_2O_{3(l)} + 0.75\ HfCl_{4(s)}$.

12. The method of claim 1, wherein the reaction of the oxide material in the etching medium also produces a non-fluid reaction product.

13. The method of claim 12, wherein the non-fluid reaction product comprises a solid reaction product that accumulates on the oxide material and causes the reaction of the oxide material and the etching medium to be self-limiting in character.

14. The method of claim 1, wherein the removable fluid reaction product comprises $P_2O_3$ and the reaction of the oxide material and the etching medium is conducted so that $P_2O_{3(l)}$ accumulates on the oxide material and causes the reaction of the oxide material and the etching medium to be self-limiting in character.

15. The method of claim 14, further comprising removing the accumulated $P_2O_{3(l)}$ from the oxide material by contacting the accumulated $P_2O_{3(l)}$ with at least one of HCl and $Cl_2$.

16. The method of claim 1, wherein the reaction of the oxide material and the etching medium produces, in addition to the removable fluid reaction product, a solid reaction product that accumulates on the oxide material and causes the reaction of the oxide material and the etching medium to be self-limiting in character.

17. The method of claim 16, wherein removal of the accumulated solid reaction product from the oxide material comprises reacting the accumulated solid reaction product with an effective chemical reactant.

18. A method of vapor phase etching comprising:
   contacting the oxide material with an etching medium to effect reaction of the oxide material and etching medium, wherein the oxide material comprising at least one of hafnia (HfO$_2$) and zirconia (ZrO$_2$), in the absence of plasma exposure of the oxide material, and wherein the etching medium comprising at least one of phosphorus chloride and tungsten chloride;

under conditions producing a liquid and/or solid reaction product that limits etching rate and/or etching depth of the oxide material in the vapor phase etching thereof;

terminating the reaction of the oxide material and the etching medium; and removing the liquid and/or solid reaction product from the oxide material.

19. The method of claim 18, wherein removing the liquid and/or solid reaction product from the oxide material comprises volatilizing the liquid reaction product.

20. The method of claim 18, wherein removing liquid and/or solid reaction product from the oxide material comprises reacting the liquid and/or solid reaction product with a removingly effective chemical reactant, wherein the removingly chemical reactant reacts with the liquid and/or solid reaction product to produce a gaseous or vapor reaction product.

21. The method of claim 18, further comprising modulating the reaction of the oxide material and the etching medium to control depth of etching of the oxide material by the etching medium.

\* \* \* \* \*